United States Patent [19]

Campbell

[11] Patent Number: 4,716,381

[45] Date of Patent: Dec. 29, 1987

[54] HIGH-CURRENT OPERATIONAL AMPLIFIER

[75] Inventor: David L. Campbell, Sunnyvale, Calif.

[73] Assignee: Advanced Micro Devices, Inc., Sunnyvale, Calif.

[21] Appl. No.: 847,804

[22] Filed: Apr. 3, 1986

[51] Int. Cl.$^4$ .............................................. H03F 3/45
[52] U.S. Cl. .................................. 330/256; 330/257; 330/260; 330/261; 330/294
[58] Field of Search ................. 330/69, 256, 257, 260, 330/261, 294, 306, 107

[56] References Cited

U.S. PATENT DOCUMENTS

| | | | |
|---|---|---|---|
| 3,491,307 | 1/1970 | Solomon et al. | 330/260 X |
| 4,187,472 | 2/1980 | Yum | 330/260 X |
| 4,323,854 | 4/1982 | Hester | 330/256 |
| 4,479,094 | 10/1984 | Harris | 330/261 |

OTHER PUBLICATIONS

Knorr et al, "A New Interface Amplifier Concept for Fast D/A Converters", *IEEE J. of Solid-State Circuits*, vol. SC-14, No. 4, Aug. 1979, pp. 734-741.

Richards, "Very Wideband Amplifiers Using Transistor Feedback Pairs", *Proc. IEE*, vol. 117, No. 10, Oct. 1970, pp. 1949-1952.

*Primary Examiner*—James B. Mullins
*Attorney, Agent, or Firm*—Patrick T. King; Kenneth B. Salomon; J. Vincent Tortolano

[57] ABSTRACT

An operational amplifier suitable for inclusion in an integrated circuit device operating as a transceiver at a coaxial media interface to a network meeting IEEE 802.3 standards. To be included in an integrated circuit package the operational amplifier must have low-power consumption and yet generate up to 80 mA of current onto the network. A design method achieves this goal, producing an operational amplifier having three independently-positioned, isolated, poles. A current generator and level shifter is employed with the operational amplifier which generates a current precisely proportional to a "collision" reference voltage, the current is compensated for changes in temperature and for variations in transistor gain (hFE). A very wide band level shifter matches the current generated to the requirements of the operational amplifier so that 10% to 90% changes in current generated by the op amp can occur in ¼ to ¾ of a nanosecond, yet the level shifter does not consume much power. The current generator provides a single point of circuit element control for compensating for hFE variation in three transistors used within the current generator. The level shifter employs current-steering to produce the switched current which is exceptionally fast and low in asymmetry. The process used in integrated circuit manufacture permits tight control of the elements within the operational amplifier so that parameters can be held within 2% of the tolerances specified in the IEEE 802.3 standards without need of field "trimming".

4 Claims, 3 Drawing Figures

HIGH-CURRENT OPERATIONAL AMPLIFIER

FIELD OF THE INVENTION

This invention relates to electrical circuits employed in high-frequency serial data transmission operational amplifiers and, more particularly, to a low power dissipation amplifier housed in a single-chip integrated circuit capable of supplying high current to a node of a network meeting the IEEE 802.3 standard.

BACKGROUND OF THE INVENTION

A set of standards have been promulgated by the Institute of Electrical and Electronic Engineers (IEEE) which specify the port characteristics for a coaxial media interface to Data Terminal Equipment (DTE). In an IEEE 802.3 (Type A)/Ethernet application, a coaxial (0.4 inch diameter) media interface is established to the DTE through an isolating pulse transformer. In an IEEE 802.3 (Type B)/Cheapernet application, the coaxial (0.2 inch diameter) media interface is established directly to the DTE.

At the coaxial media interface, the amplifier used for supplying data for transmission over the interface generates signals for a "tap driver" amplifier which must meet exacting output requirements. When transmitting, the tap driver provides an output current which is 41 milliamp (mA) on the average and 82 mA peak, with a square-wave minimum rise time and fall time of 20 nanosecond (nS) and maximum rise time and fall time of 30 nS. When not transmitting, the tap driver should exhibit an input resistance greater than 100 kilo ohms.

The prior art employed discrete components and implemented current switching through delay lines and post-switch filtering to approximate the output waveform. Alternatively, analog filtering of a square wave was used. The former approach is not suited for an integrated circuit because of the high power required to drive steered current and the high power dissipation associated with steering current from the load to the integrated circuit when transmitting.

A gated current could be generated which would eliminate the non-transmitting power dissipation, but would not result in lower power dissipation during transmission into a short circuit. Accordingly, the prior art amplifiers are unsuited for use in tap driver to be constructed on a single integrated circuit chip package capable of dissipating one watt total power.

A node of a network satisfying the IEEE 802.3 standards must also evidence a precise dc voltage when transmitting for detection by other network nodes, so as to avoid "collisions". A high-frequency ac signal is superimposed on this dc voltage; the ac signal representing the data transmitted over the network.

SUMMARY OF THE INVENTION

A wideband, high-current, controlled spectral response operational amplifier (op amp) housed on an integrated circuit and suitable for use as a tap driver meeting the IEEE 802.3 standard is provided by the instant invention. The op amp has very low power consumption and small voltage supply requirements, low offset voltage and high output resistance for the amount of current it can supply, 80 mA peak. The driver is organized as an op amp operating in class AB output to decrease the short-circuit power dissipation. In addition, a resistor external to the integrated circuit housing the op amp of the present invention allows a user to determine its current output.

In a preferred embodiment, the operational amplifier is driven by a current source and has three independently placed, isolated poles with peaked response; one pole at its input, one pole at a feedback path, and one pole at its output. The pole positions are selected to provide waveshaping to satisfy the IEEE 802.3 standard.

A current generator portion of the op amp receives a precise collision reference voltage ($V_{COL}$) and generates a temperature-compensated current proportional to the voltage. The current generator supplies a level shifter portion of the op amp with signals which drive the op amp so that it can meet the IEEE 802.3 standard. The level shifter produces a fast transition between the on and off states of the op amp, which is symmetrical; a 10% to 90% change of the current input to the op amp occuring in $\frac{1}{2}$ to $\frac{3}{4}$ of a nanosecond (ns). The level shifter is of a non-saturating design which consumes very little power. The resulting speed-power product is excellent. The current driving the op amp is within 2% of a design value without need for field trimming. A single resistor within the current generator provides $h_{FE}$ (gain) compensation for three transistors within the generator. The negative supply voltage for the op amp can be floated at a user-specified value with respect to the voltage on the integrated circuit substrate.

DETAILED DESCRIPTION OF A PREFERRED EMBODIMENT

Figure 1:
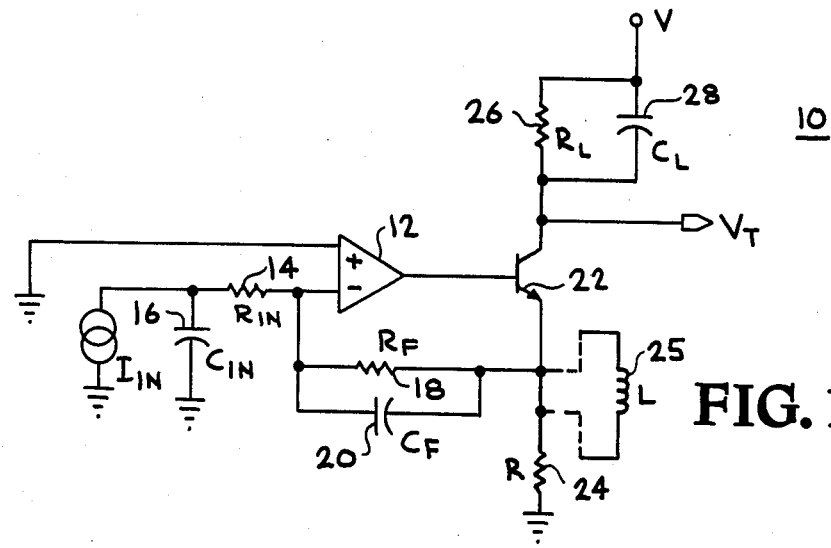
FIG. 1 is an equivalent circuit of an op amp according to the instant invention having three independent poles for wave shaping.

With reference to FIG. 1, an equivalent circuit of a single-ended operational amplifier (op amp) 10 with three independent poles is illustrated which is suitable for use as a tap driver in an integrated circuit providing an interface meeting the IEEE 802.3 standards.

The op amp 10 translates input current ($I_{IN}$) into output voltage ($V_T$) which is transmitted onto a network node for transmission to another node. An ideal differential operational amplifier 12 has its non-inverting input terminal connected to ground potential and its inverting input terminal connected to a first lead of a resistor ($R_{IN}$) 14. The second lead of resistor 14 is connected to the source of input current ($I_{IN}$). A first lead of a capacitor ($C_{IN}$) 16 is connected to the second lead of resistor 14 and the second head of capacitor 16 is connected to ground potential.

A first lead of a feedback resistor ($R_F$) 18 is connected to the inverting input terminal of amplifier 12 as is the first lead of a feedback capacitor ($C_F$) 20. The second leads of resistor 18 and capacitor 20 are connected to the emitter of an NPN transistor 22. A first lead of a resistor (R) 24 is also connected to the emitter of transistor 22 and the second lead of resistor 22 is connected to ground potential.

The base of transistor 22 is connected to the output terminal of amplifier 10 and the collector of transistor 22 is connected to a first lead of a load resistor ($R_L$) 26 and a first lead of a load capacitor ($C_L$) 28. The second leads of resistor 26 and capacitor 28 are connected to a source of voltage (V). The transmitted voltage $V_T$ is the voltage appearing at the collector of transistor 22.

The op amp 10 of the present invention is preferably constructed as a portion of an integrated circuit package in which all elements illustrated in FIG. 1 are internal to the package except resistors R (24) and $R_L$ (26) and capacitor $C_L$ (28). These three circuit elements are user-supplied externally to the integrated circuit package so that the position of one of the three poles realized by op amp 10 can be precisely adjusted.

As will be appreciated by those skilled in the art, the pole positions of op amp 10 determine the rise and fall times ($t_r$, and $t_f$, respectively) of the signals generated by the op amp as well the harmonic insertion loss with respect to the fundamental frequency (10 mHz) in the application envisioned by the invention). Combined insertion loss is the sum of the individual pole contributions when expressed in logarithmic form. If each pole position is located with precision, an optimum ratio of signal power transmitted to harmonic signal transmitted can be achieved.

For the design of the tap driver employing the op amp 10 of the instant invention, the position of poles 2 and 3 associated with $R_F$ 18 and $C_F$ 20, and $R_L$ 26 and $C_L$ 28, respectively, are set equal at 20 MHz ($K_2 = K_3 = 2.0$) and the pole 1 associated with $R_{IN}$ 14 and $C_{IN}$ 16 is set to 30 MHz, ($K_1 = 3.0$) at a nominal temperature of 25° C.

Table I indicates the insertion loss in dB for this selection of pole locations, as determined from the expression $$\left| \frac{V_o}{I_{IN}} \right| = \frac{K_1}{(K_1^2 + N^2)^{\frac{1}{2}}} \cdot \frac{K_2}{(K_2^2 + N^2)}$$

Where N is the Nth odd harmonic for a square-wave input at 10 MHz, $\tau_i$ is the time constant associated with the ith pole, i=1, 2, and 3, and $V_o$ is the voltage across $R_L$ 26 and $C_L$ 28.

TABLE I

Insertion Loss from 10 MHz in dB for an ideal 3 Pole Filter with $\tau_2 = \tau_3$ and $\tau_1 = \frac{2}{3} \tau_2$

| N | Square Input | $\tau_1$ | $\tau_2, \tau_3$ | Harmonic Output | Insertion Loss |
|---|---|---|---|---|---|
| 1 | 0 | −0.46 | −1.94 | −2.41 | 0 |
| 3 | −9.54 | −3.01 | −10.24 | −22.79 | −20.38 |
| 5 | −13.98 | −5.77 | −17.21 | −36.96 | −34.55 |
| 7 | −16.90 | −8.09 | −22.44 | −47.43 | −45.02 |
| 9 | −19.09 | −10.00 | −26.54 | −55.63 | −53.22 |

Under certain conditions, a fourth pole position may be desirable. If an inductance L 25 is placed in series with resistor R 24 of FIG. 1, a fourth pole is created. However, if such a fourth pole is undesirable, resistor R 24 must be of a low-inductance type.

The pole positions established for the op amp 10 were a result of a compromise of the following factors:
(1) average dc transmitted level;
(2) $t_r$, $t_f$ control;
(3) $t_r$-$t_f$ linearity;
(4) internal pole position ($\tau_1$, $\tau_2$) control;
(5) absolute control of fundamental component of transmission level; and
(6) third harmonic of transmission level is subordinate to $t_f$ and $t_r$.

Figure 2:
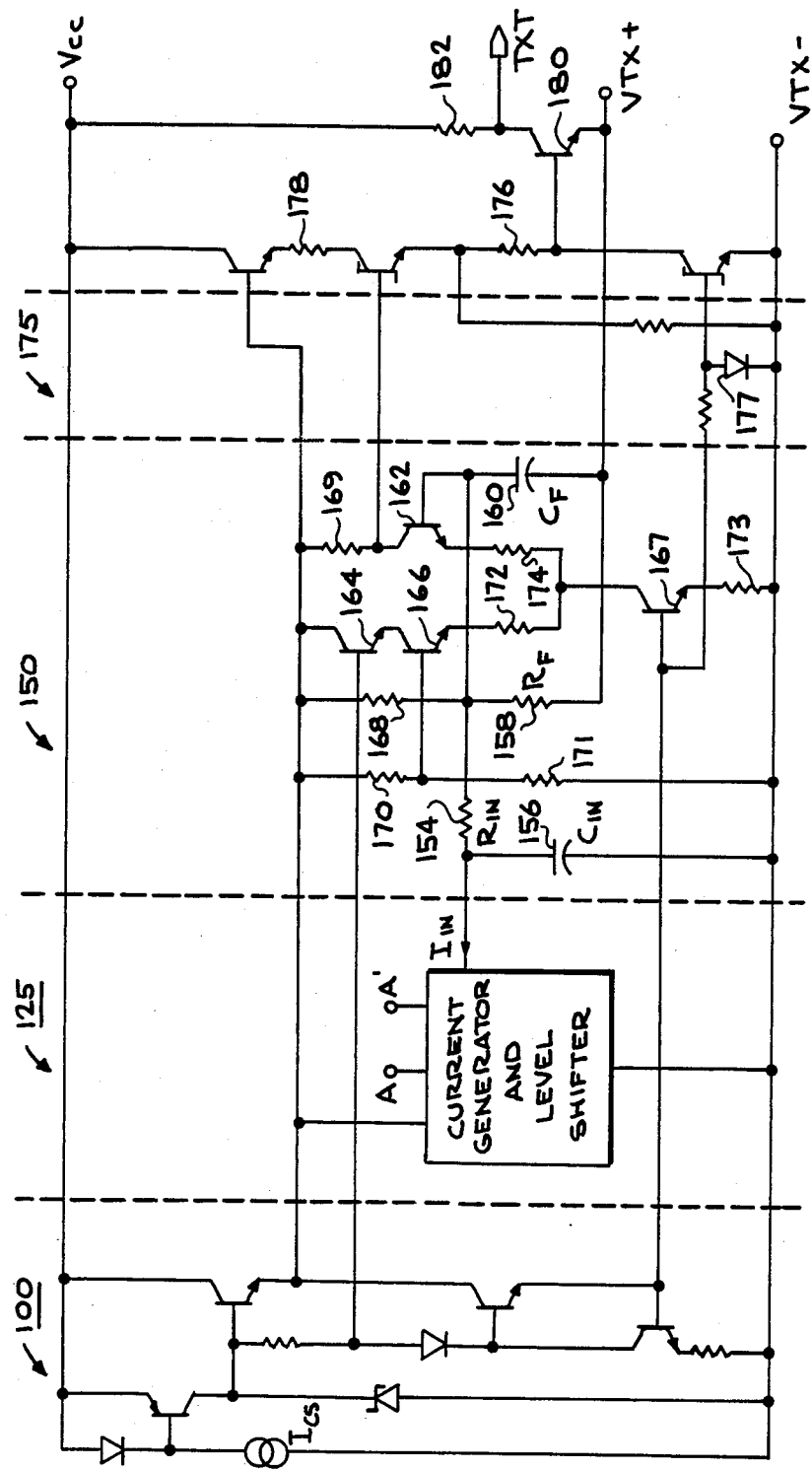
FIG. 2 is a schematic circuit of a tap driver employing an op amp of the instant invention.

With reference to FIG. 2, an application of the op amp 10 of the instant invention is shown in a tap driver. The tap driver is within the transmitter portion of an integrated circuit chip which performs transmit, receive and collision detection at the coaxial media interface to Data Terminal Equipment (DTE) and meets the IEEE 802.3 standards. The Advanced Micro Devices, Inc. manufactures the integrated circuit chip and designates it as product Am7996.

The tap driver portion is shown in FIG. 2 divided by vertical dashed lines into four subcircuits; subcircuit 100 providing compensated voltage references for the remaining three subcircuits 125, 150 and 175 receiving an input voltage $V_{CC2}$ and an input from current source $I_{CS}$. As this compensation subcircuit is unrelated to the instant invention and is familiar to those skilled in the art, it will not be described in further detail herein.

The next subcircuit shown in FIG. 2 comprises a current generator and level shifter 125 which receives at a pair of differential terminals, A and A¹, the data signals to be waveshaped and transmitted at the coaxial interface current generator and level shifter 125 will be described in detail hereinafter in connection with FIG. 3.

The subcircuit 150 comprises the op amp 10 of the instant invention, and will be described hereinafter. Subcircuit 175 comprises the output stage of the tap driver and is an emitter-follower buffer as will be appreciated by those skilled in the art and accordingly will not be described in further detail herein.

The output stage 175 generates a signal received at the base of a transistor 180 which controls the conductivity of transistor 180 and, accordingly, the current and voltage generated at a transmit terminal (TXT) of the integrated circuit which supplies signals to be transmitted to the coaxial media. The collector of transistor 180 is also connected to a first lead of a resistor 182. Resistor 182 has its second lead connected to a source of positive voltage ($V_{CC2}$). Resistor 182 limits output impedance of the output stage 175 so as to achieve good fall time in the signal generated thereat. The emitter of transistor 180 is connected to a source of positive voltage for the transmitter (VTX+).

Figure 3:
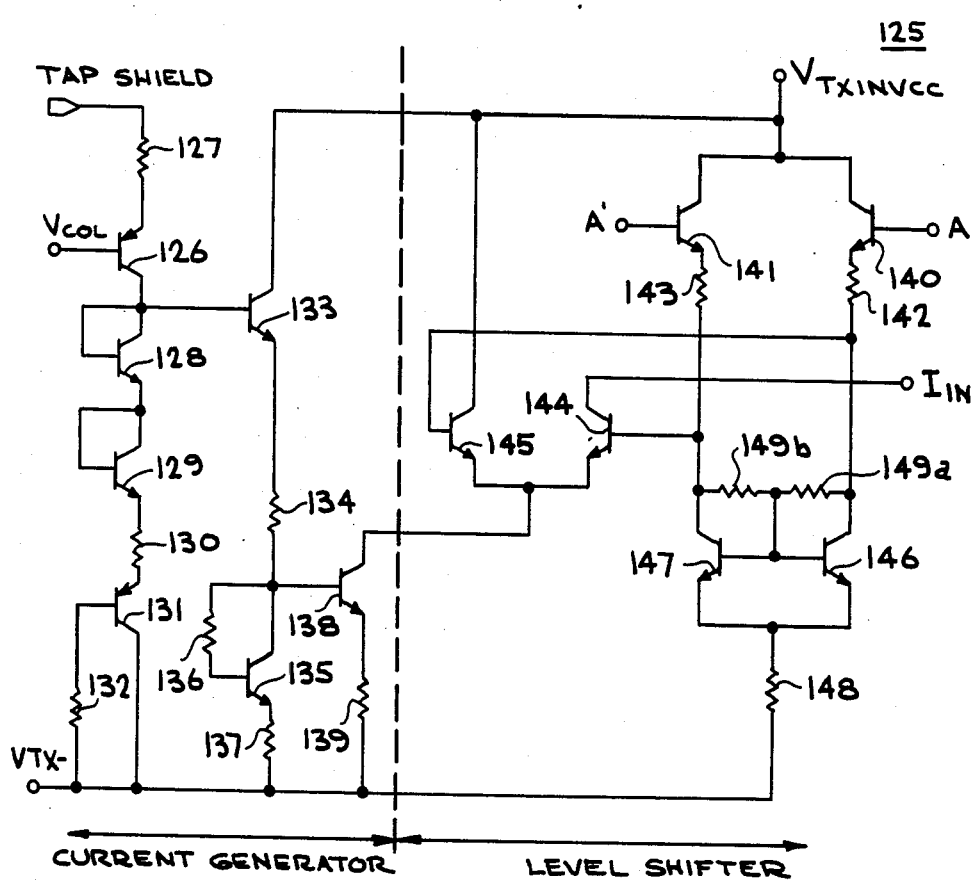
FIG. 3 is a schematic diagram of the level shifter and current generator portion of the instant invention.

FIG. 3 illustrates the current generator and level shifter 125 of the instant invention in schematic form. The current generator portion includes a PNP transistor 126 receiving at its base a collision detection reference voltage ($V_{COL}$). In the application of circuit 125 within the Am7996 transmitter, receiver and collision detector device, $V_{COL} = 1600$ millivolts (mV) ±30 mV.

The emitter of transistor 126 is connected to a TAP SHIELD terminal of the integrated circuit housing the circuit 125 via a resistor 127. The nominal potential of this terminal, $V_{TAPSHIELD}$, is ground potential. The collector of transistor 126 is connected to a series connection of a pair of diode-connected NPN transistors 128 and 129 and a resistor 130 which, in turn, is connected to the emitter of a PNP transistor 131. The collector of transistor 131 is connected to a source of negative voltage (VTX−) and the base of transistor 131 is connected to VTX− via a resistor 132.

The collector of transistor 126 is connected to the base of an NPN transistor 133. The emitter of transistor 133 is connected to a first lead of a resistor 134. The second lead of resistor 134 is connected to the collector of an NPN transistor 135 and to the first lead of a resistor 136, whose second lead is connected to the base of transistor 135. The emitter of transistor 135 is connected to VTX— via a resistor 137.

The base of an NPN transistor 138 is connected to the junction formed from resistors 134 and 136 and the collector of transistor 135. The emitter of transistor 138 is connected to VTX— via a resistor 139.

Constant voltage is produced across resistors 137 and 139. Two error terms exist in the current generator circuit comprising the elements 126–139 shown to the left of the dashed line of FIG. 3. The current density in transistors 128 and 129 equals that in transistors 133 and 135 at only a single temperature. Also the base current in transistor 133 subtracts from the collector current in transistor 126 to produce an $h_{FE}$-dependent error, and thus the resulting current is temperature and process dependent.

Current gain ($h_{FE}$) error introduced by the base current in transistor 133 may be compensated using several circuit implementations. The circuit shown in FIG. 3 represents a compromise between dc error and high frequency rejection for the voltage TXINVCC generated at the collector of transistor 133.

First-order $h_{FE}$ compensation for the transistors 133, 135 and 138 is achieved by resistor 136. The error referred to resistor 136 from base current in transistor 135, for the particular element values of the circuit of FIG. 1, is $$I_{B(135)}\frac{R}{8} = \frac{V_0}{8(h_{FE}+1)} \text{ or } R_{136}(I_{B(135)}) = \frac{R}{8}$$

where $V_0$ is the potential of the collector of transistor 126, resistor 127 has a resistance of R and $I_{B(135)}$ is the base current in transistor 135.

Superposition of base current in transistor 138 and base current in transistors in the level shifter portion of the circuit 125, in series, under the assumption that $I_{IN} \approx I_{E(138)}(-1-2/4h_{FE})$ at half current gives an additional error of R/8.

The current generator portion of circuit 125 of FIG. 1 then translates the reference voltage $V_{COL}$ from a positive ground to a negative ground with fully-compensated output voltage $V_{TXINVCC}$ and generates a $V_{BE}$ compensated voltage with $h_{FE}$ compensation. The current ($I_1$) conducted via the collector of transistor 138 is precisely proportional to $V_{COL}$-$V_{TAPSHIELD}$ and is temperature-compensated.

The level shifter portion of circuit 125, shown to the right of the dashed vertical line in FIG. 3, receives differential input signals A and A' at the base of a pair of NPN transistors 140 and 141, respectively. The collectors of transistors 140 and 141 are connected to the collector of transistor 133 which provides the fully-compensated voltage $V_{TXINVCC}$. The emitters of transistors 140 and 141 are connected to first leads to resistors 142 and 143, respectively. The second leads of resistors 142 and 143 are connected to collectors of NPN transistors 144 and 145, respectively.

The emitters of transistors 144 and 145 are connected in common and to the collector of transistor 138 which supplies the compensated $V_{BE}$ voltage, to the level shifter portion of circuit 125.

The second leads of transistors 142 and 143 also connect to the collectors of NPN transistors 146 and 147, respectively. The emitters of transistors 146 and 147 are connected in common and to VTX— via a resistor 148. The collectors of transistors 146 and 147 are connected to the first leads of resistors 149a and 149b, respectively.

The second leads of resistors 149a and 149b are connected in common and to the bases of transistors 146 and 147 which are connected in common.

The collector of transistor 145 is connected to voltage source $V_{TXINVCC}$ and the current $I_{IN}$ generated at the collector of transistor 144 which is supplied to the operational amplifier portion 150 of the tap driver of which circuit 125 of FIG. 3 is a part.

The current $I_{IN}$ generated by the right-hand portion of the circuit of FIG. 3 is free from first order $h_{FE}$ error and is proportional to the reference voltage $V_{COL}$ supplied to the current generator portion of the circuit of FIG. 3. The current $I_{IN}$ is also independent of temperature within the operating range of 0° C. to +70° C., provided the current applied at the differential inputs A and A' is temperature-independent. The current $I_{IN}$ is constant over output voltages from 250 mV to $V_{CEMAX}$. The output voltage is temperature independent when terminated by resistors of like kind.

The portion of the level shifter circuit of circuit 125 comprising transistors 146 and 147 supplies compensated reference voltage for the bases of transistors 144 and 145 and a fast transition between on and off states. A 10% to 90% change in $I_{IN}$ occurs in ½ to ¾ nsec and produces the change with symmetrical turn-on and turn-off characteristics. This is accomplished by the transfer of charge over the resistors 149a and 149b without causing saturation in transistor 146 or transistor 147. Accordingly, the level shifter can pass a 1½ nsec pulse at very low power consumption levels.

The ability of circuit 125 to generate an $I_{IN}$ current satisfying these criteria at very low levels of power consumption allows the tap driver, and in particular, the operational amplifier portion 150 thereof, to be housed on an integrated circuit chip without need of field trimming. In the embodiment of the instant invention within integrated circuit Am7996, the value of current $I_1$ is held to a tolerance of +2% without the need for trimming.

With reference again to FIG. 2, the op amp 10 portion of the tap driver, subcircuit 150, receives the current $I_{IN}$ generated by current generator and level shifter 125. In response to the signals applied at the A and A¹ terminals thereof, the current $I_{IN}$ is conducted from the junction of a resistor ($R_{IN}$) 154 and a capacitor ($C_{IN}$) 156, which correspond to resistor 14 and capacitor 16 of FIG. 1. The parasitic capacitance of the current source within the level shifter portion of subcircuit 125 in parallel with $C_{IN}$ determines the input pole position. A feedback resistor ($R_F$) 158 and a feedback capacitor ($C_F$) 160 are connected in parallel to the resistor $R_{IN}$ 154 and to the positive voltage VTX+. The signal at one junction of the parallel combination of $R_F$ 158 and $C_F$ 160 is applied to the base of an NPN transistor 162 which forms a portion of a differential amplifier corresponding to amplifier 12 of FIG. 1.

An NPN transistor 164 receives at its base a voltage generated by the subcircuit 100 portion of the tap driver which sets a voltage threshold determining the center about which operational amplifier 150 operates. The collector of transistor 164 is connected to the source of voltage $V_{TXINVCC}$ and its emitter connects to the collector of an NPN transistor 166 which, together with transistor 162, form a differential-in, single-end-out differential amplifier stage. A resistor 168 couples the junction of resistors 154 ($R_{IN}$) and 158 ($R_F$) to the voltage $V_{TXINVCC}$. The collector of transistor 162 is connected to the $V_{TXINVCC}$ source via a resistor 169. The base of transistor 166 is connected to the common junction of a resistor 170 and a resistor 171 which are connected between the $V_{TXINVCC}$ source $c_{ad}$ VTX−.

The emitters of transistors 166 and 162 are connected to a first lead of resistors 172 and 174, respectively. The second leads of resistors 172 and 174 are connected together and to the collector of an NPN transistor 167 which has its emitter connected to VTX− via a resistor 173. The base of transistor receives a voltage generated by the subcircuit 100. Resistor 173 is selected together with a resistor within subcircuit 100 to establish the center of operation of the differential amplifier.

The signal generated at the collector of transistor 162 is applied to the emitter follower buffer subcircuit 175 of the tap driver. A resistor 176 within the subcircuit 175 provides temperature compensation which is a function of the voltage across the zener diode and the two diodes which are within subcircuit 100 as well as the diode 177 within subcircuit 175. As temperature increases, these voltages increase and a resulting reverse bias voltage is applied to transistor 162. Resistor 178 provides short circuit current limitation.

A 3:1 ratio in the resistances of resistors 170 and 171 provides the proper operating bias for the transistor 166. Resistors 168 and 171 are thermally-matched to provide equal thermal gradients. The current density in transistors 162 and 166, and resistors 174 and 172, is purposely mismatched to improve turnoff to zero and temperature-compensated to provide a good match at the high temperature operating range. The low power consumption of the differential amplifier results from this mismatch.

The signal generated at the collector of transistor 162 is conducted to the base of one of the transistors used in the output stage 175 of the tap driver. The signal generated therefrom by stage 175 is received by transistor 180 which corresponds to transistor 22 of FIG. 1. The remaining elements shown in FIG. 1, resistors R (24) and $R_L$ (26) and the capacitor $C_L$ (28) are connected externally to the integrated circuit housing the tap driver of FIG. 2. The external resistor, connected between the VTX+ and VTX− terminals, determines the peak current available at the TXT terminal according to the quotient 800 mV/R in the embodiment of the invention employed in the Am7996 product.

The voltage at the base of transistor 162 is nominally 1.25 volts and the voltage at the TXT terminal ranges between the static levels of zero and 800 mV. Due to the design of the amplifier of the instant invention, the common-mode rejection is very high, and is typically less than 5 mV offset voltage without need of trimming. The subtrate of the integrated circuit housing the amplifier of the instant invention can be at a voltage floated at a user-determined value with respect to VTX−.

I claim:

1. In an integrated circuit transceiver, including a differential operational amplifier generating signals to be transmitted over a node meeting IEEE 802.3 standards, a circuit which translates a reference voltage from positive ground to negative ground and generates a current-gain ($h_{FE}$)- and and temperature-compensated output current received by said operational amplifier constant within an operating voltage range and proportional to said reference voltage, comprising a current generator circuit and a level-shifter circuit, said current generator circuit comprising:

a first transistor having a base terminal connected to said reference voltage, an emitter terminal coupled through a first resistance element to a tap shield terminal, and a collector terminal; and compensation means comprising:

a second transistor having an emitter terminal, a collector terminal connected to a first voltage supply, and a base terminal coupled to said first voltage supply through a second resistance element;

a third transistor having a collector terminal, a base terminal coupled to said third transistor collector terminal through a third resistance element, and an emitter terminal coupled to said first voltage supply through a fourth resistance element;

a fourth transistor having a base terminal connected to said third transistor collector terminal, an emitter terminal coupled to said first voltage supply through a fifth resistance element, and a collector terminal;

a series of two diode-connected transistors, a first of said series having its anode terminal connected to said first transistor collector terminal and a second of said series having a cathode coupled to said second transistor emitter terminal through a sixth resistance element; and a fifth transistor having a base terminal connected to said first transistor collector terminal, an emitter terminal coupled to said third transistor collector through a seventh resistance element, and a collector whereby an intermediate current is conducted by, and an $h_{FE}$-compensated base voltage generated at, said fourth transistor collector terminal and a negative-ground translated reference voltage generated at said fifth transistor collector terminal, said level-shifter comprising means responsive to differential input signals, said negative-ground translated reference voltage and said $h_{FE}$-compensated base voltage and intermediate current, for generating said output current.

2. A current generator and level-shifter according to claim 1 wherein said level-shifter means comprises:

first amplifier stage means responsive to said differential input signals for generating a pair of base currents;

means coupled to said first amplifier stage for steering portions of said base currents to said first voltage supply; and second amplifier means responsive to non-steered portions of said base currents, to said $h_{FE}$-compensated base voltage and to said intermediate current for generating said output current.

3. A current generator and level-shifter according to claim 2 wherein said current-steering means comprises a pair of NPN transistors interconnected at their bases, interconnected at their emitters, said interconnected emitters coupled to said first voltage supply through a resistance element, their collectors interconnected via a series-connected pair of resistors, the common junction of said resistors connected to said interconnected bases, said collectors each receiving said portion of said base current; said pair of NPN transistors operating in a non-saturated mode.

4. A current generator and level-shifter according to claim 3 wherein said second amplifier means comprises a pair of NPN transistors, their emitters interconnected and connected to said fourth transistor collector terminal, their bases connected to said respective collectors of said pair of current-steering transistors, said output current generated at the collector of a predetermined one of said second amplifier means transistors.

* * * * *